(12) United States Patent
Uenaka et al.

(10) Patent No.: US 8,836,011 B2
(45) Date of Patent: Sep. 16, 2014

(54) NONVOLATILE SEMICONDUCTOR MEMORY DEVICE

(75) Inventors: Tsuneo Uenaka, Mie-ken (JP); Yoshiro Shimojo, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 47 days.

(21) Appl. No.: 13/564,972

(22) Filed: Aug. 2, 2012

(65) Prior Publication Data

US 2013/0105902 A1    May 2, 2013

(30) Foreign Application Priority Data

Nov. 1, 2011    (JP) .................................. 2011-240568

(51) Int. Cl.
    *H01L 29/792*    (2006.01)
    *H01L 29/66*    (2006.01)
    *H01L 27/115*    (2006.01)

(52) U.S. Cl.
    CPC ...... *H01L 29/66833* (2013.01); *H01L 29/7926* (2013.01); *H01L 27/11582* (2013.01)
    USPC ....................................................... 257/324

(58) Field of Classification Search
    USPC .................... 257/324, 316, E21.21, E21.409, 257/E29.309, E21.473; 438/591, 283, 588
    See application file for complete search history.

(56) References Cited

U.S. PATENT DOCUMENTS

| 8,164,956 | B2 | 4/2012 | Maeda | |
|---|---|---|---|---|
| 2011/0018052 | A1* | 1/2011 | Fujiwara et al. | ............... 257/324 |
| 2011/0188321 | A1* | 8/2011 | Kito et al. | ............... 365/185.29 |
| 2011/0309431 | A1* | 12/2011 | Kidoh et al. | .................. 257/324 |
| 2012/0211820 | A1* | 8/2012 | Komori et al. | ................ 257/324 |
| 2012/0235221 | A1* | 9/2012 | Ishiduki et al. | ............... 257/324 |

FOREIGN PATENT DOCUMENTS

JP    2011-61159    3/2011

* cited by examiner

*Primary Examiner* — Jarrett Stark
*Assistant Examiner* — Shahed Ahmed
(74) *Attorney, Agent, or Firm* — Oblon, Spivak, McClelland, Maier & Neustadt, L.L.P.

(57) ABSTRACT

According to one embodiment, a nonvolatile semiconductor memory device includes a semiconductor layer, first and second stacked bodies, first and second channel body layers, first and second memory films. The first stacked body includes electrode layers and first insulating films alternately stacked on the semiconductor layer. The first channel body layers pierces through the first stacked body in a stacking direction. Lower ends of the first channel body layers are connected. The first memory film is provided between the first channel body layers and the electrode layers. The second channel body layers pierces through the first stacked body in the stacking direction. Lower ends of the second channel body layers are connected. The second memory film is provided between the second channel body layers and the electrode layers. The second stacked body includes a first interlayer insulating film and a select gate layer.

14 Claims, 16 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-240568, filed on Nov. 1, 2011; the entire contents of which are incorporated herein by reference.

FIELD

Embodiments described herein relate generally to a nonvolatile semiconductor memory device.

BACKGROUND

In these years, attention is focused on nonvolatile semiconductor memory devices including memory cells three-dimensionally disposed in the nonvolatile semiconductor memory device for enhancing the integration degree of the nonvolatile semiconductor memory device.

One of the nonvolatile semiconductor memory devices including memory cells three-dimensionally disposed is a nonvolatile semiconductor memory device using a transistor in a columnar structure. The semiconductor memory device using the transistor in the columnar structure includes an electrode layer to be a gate electrode in multiple layers, a pillar channel body layer, and a memory film provided between the gate electrode and the channel body layer. The structure including the conductive layer, the channel body layer, and the memory film is called a memory string structure.

In this type of nonvolatile semiconductor memory device, one end of a memory string is individually connected to a plurality of read bit lines, and the other end of the memory string is connected to a common source line. In the case where the bit line is provided on the source line, a distance of a via electrode connecting the bit line to the memory string is inevitably made longer than a distance of a via electrode connecting the source line to the memory string.

In such a configuration, when the downscaling of the individual portions in a memory cell advances, it is sometimes difficult to electrically connect the memory string to the other interconnections connected to the memory string (the bit line, for example).

DETAILED DESCRIPTION

Figure 1:
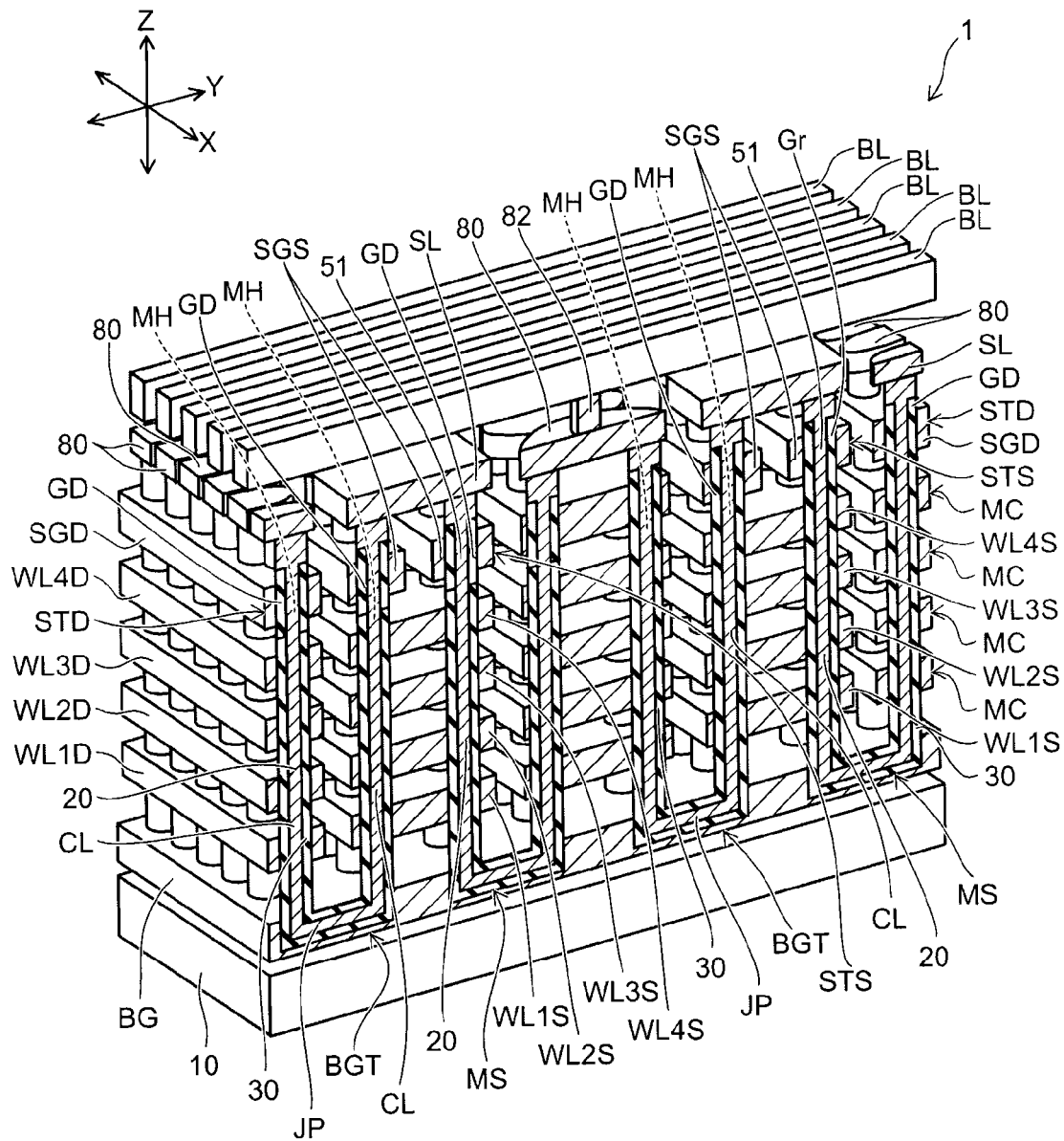
FIG. 1 is a schematic perspective view of a memory cell array of a non-volatile semiconductor memory device according to a first embodiment.

According to one embodiment, a nonvolatile semiconductor memory device includes a semiconductor layer, a first stacked body, a pair of first channel body layers, a first memory film, a pair of second channel body layers, a second memory film, a second stacked body, a second interlayer insulating film, a third channel body layer, a first gate insulating film, a fourth channel body layer, and a second gate insulating film. The first stacked body includes a plurality of electrode layers and a plurality of first insulating films alternately stacked on the semiconductor layer. The pair of first channel body layers pierce through the first stacked body in a stacking direction of the first stacked body. Lower ends of the pair of the first channel body layers are connected to each other. The first memory film is provided between the pair of the first channel body layers and the plurality of electrode layers. The pair of second channel body layers pierce through the first stacked body in the stacking direction of the first stacked body. Lower ends of the pair of the second channel body layers are connected to each other. The second memory film is provided between the pair of the second channel body layers and the plurality of electrode layers. The second stacked body includes a first interlayer insulating film provided on the first stacked body and a select gate layer provided on the first interlayer insulating film. The second interlayer insulating film is provided on the select gate layer of the second stacked body. The third channel body layer is provided at an upper end of each of the pair of the first channel body layers and pierces through the second stacked body in a stacking direction of the second stacked body. The first gate insulating film is provided between the third channel body layer and the select gate layer. The fourth channel body layer is provided at an upper end of each of the pair of the second channel body layers and pierces through the second stacked body in the stacking direction of the second stacked body. The second gate insulating film is provided between the fourth channel body layer and the select gate layer. The third channel body layer and the fourth channel body layer are disposed in a first direction perpendicular to the stacking direction. The device includes a pad layer provided on the second interlayer insulating film and electrically connects one of the adjacent third channel body layers to one of the fourth channel body layers.

Various embodiments will be described hereinafter with reference to the accompanying drawings. In the following explanation, identical components are marked with the same reference numerals, and the description of the components once described is omitted appropriately.

First Embodiment

First, the outline of a nonvolatile semiconductor memory device will be explained with reference to a schematic perspective view.

FIG. 1 is a schematic perspective view illustrating a memory cell array of a non-volatile semiconductor memory device according to a first embodiment.

Figure 3:
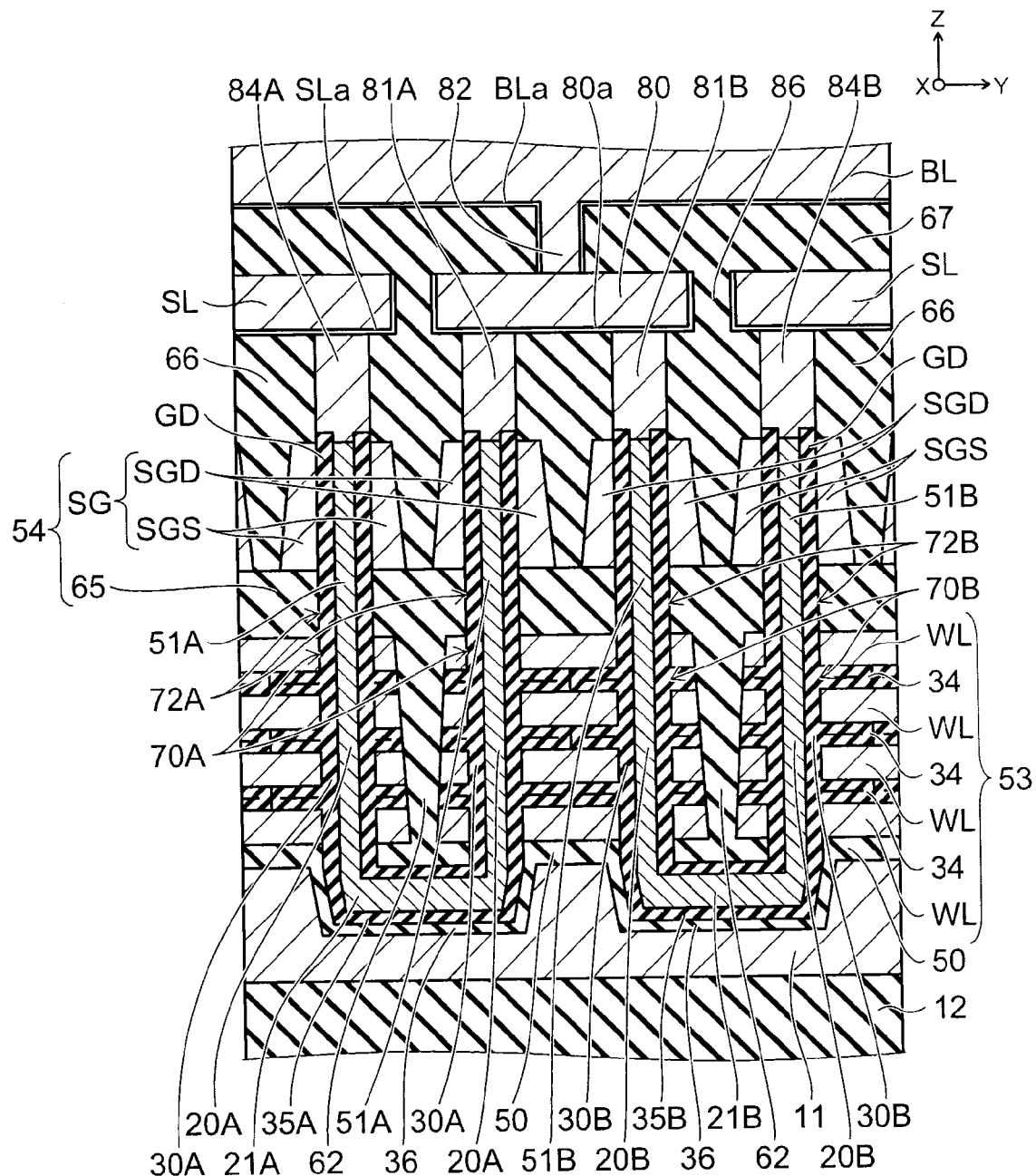
FIG. 3 is a schematic cross sectional view of the memory cell array of the nonvolatile semiconductor memory device according to the first embodiment.

In FIG. 1, insulating portions other than insulating films formed on the inner wall of a memory hole MH are omitted in the drawing for easily seeing the drawing. The insulating portions will be explained with reference to FIG. 3 showing the cross sectional structure of the memory cell array.

Figure 2:
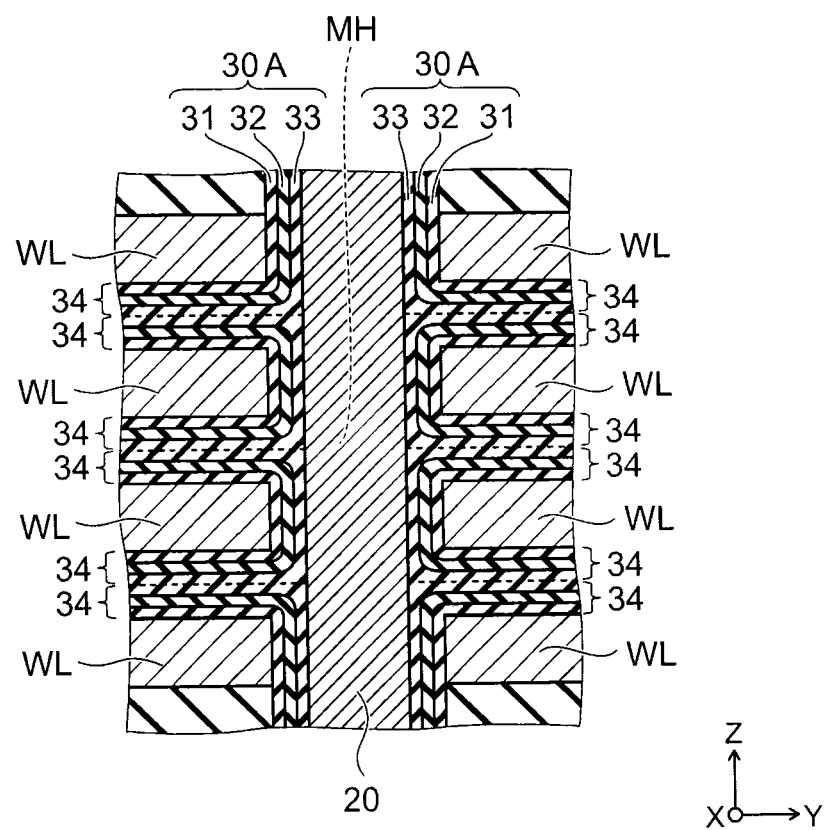
FIG. 2 is an enlarged cross-sectional view of a portion where the memory cell is provided.

FIG. 2 is an enlarged cross-sectional view illustrating a portion where the memory cell is provided.

In FIG. 1, for convenience of explanation, an XYZ rectangular coordinate system is introduced. In this coordinate system, two directions parallel with the major surface of a substrate 10 and orthogonal to each other are an X-direction and a Y-direction, and a direction orthogonal to both the X-direction and the Y-direction is a Z-direction.

In a nonvolatile semiconductor memory device 1, a back gate BG is provided on the substrate 10 through an insulating layer, not shown. The substrate 10 including this insulating layer is referred to as a base layer. In the substrate 10, an active element such as a transistor, and a passive element such as a resistor, a capacitor, or the like may be provided. The back gate BG is a conductive silicon (Si) layer doped with an impurity element, for example. In FIG. 3, a semiconductor layer (a boron-doped silicon layer) 11 corresponds to the back gate BG.

On the back gate BG, a plurality of insulating films 34 (see FIG. 2) and a plurality of electrode layers WL1D, WL2D, WL3D, WL4D, WL1S, WL2S, WL3S, and WL4S are alternately stacked on each other.

The electrode layer WL1D and the electrode layer WL1S are provided at the same level, expressing the lowermost electrode layer. The electrode layer WL2D and the electrode layer WL2S are provided at the same level, expressing the second lowermost electrode layer. The electrode layer WL3D and the electrode layer WL3S are provided at the same level, expressing the third lowermost electrode layer. The electrode layer WL4D and the electrode layer WL4S are provided at the same level, expressing the fourth lowermost electrode layer.

The electrode layer WL1D and the electrode layer WL1S are divided in the Y-direction. The electrode layer WL2D and the electrode layer WL2S are divided in the Y-direction. The electrode layer WL3D and the electrode layer WL3S are divided in the Y-direction. The electrode layer WL4D and the electrode layer WL4S are divided in the Y-direction.

An insulating layer 62 (see FIG. 3) is provided between the electrode layer WL1D and the electrode layer WL1S, between the electrode layer WL2D and the electrode layer WL2S, between the electrode layer WL3D and the electrode layer WL3S, and between the electrode layer WL4D and the electrode layer WL4S.

The electrode layers WL1D, WL2D, WL3D, and WL4D are provided between the back gate BG and a drain-side select gate SGD. The electrode layers WL1S, WL2S, WL3S, and WL4S are provided between the back gate BG and a source-side select gate SGS.

The number of layers of the electrode layers WL1D, WL2D, WL3D, WL4D, WL1S, WL2S, WL3S, and WL4S is optional, not limited to four layers illustrated in FIG. 1. In the following explanation, the electrode layers WL1D, WL2D, WL3D, WL4D, WL1S, WL2S, WL3S, and WL4S are sometimes simply expressed by the electrode layer WL.

The electrode layer WL is a conductive silicon layer doped with an impurity, for example. The electrode layer WL has electrical conductivity enough for the gate electrode. The insulating film 34 has an ONO structure, for example, described later.

The drain-side select gate SGD is provided on the electrode layer WL4D through an insulating layer, not shown. The drain-side select gate SGD is a conductive silicon layer doped with an impurity, for example.

The source-side select gate SGS is provided on the electrode layer WL4S through an insulating layer, not shown. The source-side select gate SGS is a conductive silicon layer doped with an impurity, for example.

The drain-side select gate SGD and the source-side select gate SGS are divided in the Y-direction. It is noted that in the following explanation, the drain-side select gate SGD and the source-side select gate SGS are sometimes simply expressed by the select gate SG, without distinguishing between them.

A source line SL is provided on the source-side select gate SGS through an insulating layer, not shown. The source line SL is a metal layer, or a conductive silicon layer doped with an impurity.

A plurality of bit lines BL are provided on the drain-side select gate SGD and the source line SL through an insulating layer, not shown. The bit lines BL extend in the Y-direction.

A plurality of U-shaped memory holes MH are formed on the back gate BG and the stacked body on this back gate BG. For example, in the electrode layers WL1D to WL4D and the drain-side select gate SGD, a hole piercing through them and extending in the Z-direction is formed. In the electrode layers WL1S to WL4S and the source-side select gate SGS, a hole piercing through them and extending in the Z-direction is formed. A pair of the holes extending in the Z-direction are connected to each other through a recess (a space) formed in the back gate BG for forming the U-shaped memory hole MH.

A channel body layer 20 is provided in a U-shape in the memory hole MH. The channel body layer 20 is a silicon layer, for example. A memory film 30 is provided between the channel body layer 20 and the inner wall of the memory hole MH.

A gate insulating film GD is provided between a channel body layer 51 and the drain-side select gate SGD. The gate insulating film GD is provided between the channel body layer 51 and the source-side select gate SGS. The channel body layer 51 is a silicon layer, for example.

It is noted that such a structure may be possible in which the channel body layers 20 and 51 are formed in such a way that a cavity remains on the center axis side of the memory hole MH and an insulator is buried in the cavity in the channel body layers 20 and 51, not limited to the structure in which the memory hole MH is fully buried with the channel body layers 20 and 51.

The memory film 30 has an ONO (Oxide-Nitride-Oxide) structure in which a silicon nitride film is sandwiched between a pair of silicon oxide films, for example. As shown in FIG. 2, an insulating film 31, a charge storage film 32, and an insulating film 33 are in turn provided from the electrode layer WL side between the electrode layers WL and the channel body layer 20. The insulating film 31 contacts with the electrode layer WL, the insulating film 33 contacts with the channel body layer 20, and the charge storage film 32 is provided between the insulating film 31 and the insulating film 33. It is noted that the insulating film 34 is a pair of layers each including the ONO structure. For example, the insulating film 34 has such a structure formed of a pair of layers each including the charge storage film 32 sandwiched between the insulating films 31 and 33.

The channel body layer 20 functions as a channel in a transistor forming the memory cell, the electrode layer WL functions as a control gate, and the charge storage film 32 functions as a data storage layer to store electric charges injected from the channel body layer 20. Namely, the memory cell MC is formed at the intersecting portion between the channel body layer 20 and each of the electrode layers WL in such a structure in which the control gate surrounds the channel.

The nonvolatile semiconductor memory device 1 according to the first embodiment is a non-volatile semiconductor memory device that can electrically freely erase and write data and retain stored content even after turning off a power supply.

The memory cell MC is a memory cell in a charge trap structure, for example. The charge storage film 32 has a large number of traps for trapping electric charges (electrons), and is a silicon nitride film, for example. The second insulating film 33 is a silicon oxide film, for example, and is a potential barrier in injecting electric charges from the channel body layer 20 into the charge storage film 32, or in diffusing electric charges stored in the charge storage film 32 into the channel body layer 20. The insulating film 31 is a silicon oxide film, for example, and prevents electric charges stored in the charge storage film 32 from diffusing into the electrode layer WL.

The drain-side select gate SGD, the channel body layer 51, and the gate insulating film GD therebetween constitute a drain-side select transistor STD. The channel body layer 51 above the drain-side select transistor STD is electrically connected to the bit line BL through an electrode pad (a pad layer) 80. The structure of the electrode pad 80 will be described later.

The source-side select gate SGS, the channel body layer 51, and the gate insulating film GD therebetween constitute a source-side select transistor STS. The channel body layer 51 above the source-side select transistor STS is electrically connected to the source line SL.

The back gate BG and the channel body layer 20 and the memory film 30 provided in this back gate BG constitute a back gate transistor BGT.

The memory cells MC are provided in multiple numbers between the drain-side select transistor STD and the back gate transistor BGT, including the electrode layers WL4D to WL1D for the control gate. Similarly, the memory cells MC are provided in multiple numbers also between the back gate transistor BGT and the source-side select transistor STS, including the electrode layers WL1S to WL4S for the control gate.

The pluralities of memory cells MC, the drain-side select transistor STD, the back gate transistor BGT, and the source-side select transistor STS are connected in series through the channel body layer 20 for constituting a single U-shaped memory string MS.

A single memory string MS includes a pair of columns CL extending in the stacking direction of the stacked body including the plurality of electrode layers WL and a joining portion JP buried in the back gate BG and connecting the pair of the columns CL to each other. This memory string MS is arranged in multiple numbers in the X-direction and the Y-direction, thereby three-dimensionally providing a plurality of memory cells in the X-direction, the Y-direction, and the Z-direction.

A plurality of the memory strings MS are provided in a memory cell array region in the substrate 10. A peripheral circuit to control the memory cell array is provided around, for example, the memory cell array region in the substrate 10.

FIG. 3 is a schematic cross sectional view illustrating the memory cell array of the nonvolatile semiconductor memory device according to the first embodiment. FIG. 3 shows a cross section cutting the centerline of the channel body layer 20 in parallel with the Y-direction shown in FIG. 1.

The nonvolatile semiconductor memory device 1 includes the semiconductor layer 11 containing an impurity element such as boron, for example, on a base layer 12. The semiconductor layer 11 corresponds to the back gate BG shown in FIG. 1. An insulating layer 35A (a first insulating layer) and an insulating layer 35B are provided on the surface of the semiconductor layer 11. An insulating film 36 such as a silicon oxide film is provided between the semiconductor layer 11 and the insulating layer 35a and between the semiconductor layer 11 and the insulating layer 35B.

An insulating film 50 such as a silicon oxide film is provided on the semiconductor layer 11, the insulating layer 35A, and the insulating layer 35B. A stacked body 53 (a first stacked body) is provided on the insulating film 50, including the plurality of electrode layers WL and the plurality of insulating films 34 alternately stacked on each other.

The stacked body 53 is provided with a pair of holes 70A (first holes) piercing through the stacked body 53 in the stacking direction of the stacked body 53 and reaching the insulating layer 35A. A memory film 30A (a first memory film) is provided on the sidewalls of the pair of the holes 70A. A channel body layer 20A (a first channel body layer) is provided on the inner side of the memory film 30A in each of the pair of the holes 70A. The stacked body 53 sandwiched between the pair of the holes 70A is divided in the Y-direction by the insulating layer 62 such as a silicon nitride layer.

The stacked body 53 is provided with a pair of holes 70B (second holes) piercing through the stacked body 53 in the stacking direction of the stacked body 53 and reaching the insulating layer 35B. A memory film 30B (a second memory film) is provided on the sidewalls of the pair of the holes 70B. A channel body layer 20B (a second channel body layer) is provided on the inner side of the memory film 30B in each of the pair of the holes 70B. The stacked body 53 sandwiched between the pair of the holes 70B is divided in the Y-direction by the insulating layer 62.

The pair of the holes 70A are arranged side by side in a first direction perpendicular to the stacking direction (in the Y-direction in the drawing), and the pair of the holes 70B are arranged side by side in the first direction. The pair of the holes 70A and the pair of the holes 70B are alternately arranged in the first direction when the nonvolatile semiconductor memory device 1 is seen from the direction perpendicular to the surface of the semiconductor layer 11.

A stacked body 54 (a second stacked body) is further provided on the stacked body 53. The stacked body 54 includes an interlayer insulating film 65 (a first interlayer insulating film) such as a silicon oxide film and a select gate SG provided on the interlayer insulating film 65. The select gate SG is the drain-side select gate SGD and the source-side select gate SGS as described above.

A gate insulating film GD (a first gate insulating film) is provided on the sidewall of a hole 72A (a third hole) communicating with the upper end of each of the pair of the holes 70A and piercing through the stacked body 54 in the stacking direction of the stacked body 54. A channel body layer 51A (a third channel body layer) is provided on the inner side of the gate insulating film GD in the hole 72A. Namely, the channel body layer 20A is connected to the channel body layer 51A.

A gate insulating film GD (a second gate insulating film) is provided on the sidewall of a hole 72B (a fourth hole) communicating with the upper end of each of the pair of the holes 70B and piercing through the stacked body 54 in the stacking direction of the stacked body 54.

A channel body layer 51B (a fourth channel body layer) is provided on the inner side of the gate insulating film GD in the hole 72B. Namely, the channel body layer 20B is connected to the channel body layer 51B.

A channel body layer 21A (a fifth channel body layer) is provided in the insulating layer 35A, connected to the lower end of the channel body layer 20A provided in each of the pair of the holes 70A. A channel body layer 21B (a sixth channel body layer) is provided in the insulating layer 35B, connected to the lower end of the channel body layer 20B provided in each of the pair of the holes 70. The channel body layers 21A and 21B are a silicon layer, for example.

An interlayer insulating film 66 (a second interlayer insulating film) such as a silicon oxide film is provided on the select gate SG. The electrode pad 80 is provided on the interlayer insulating film 66. The electrode pad 80 is electrically connected to the upper end of the channel body layer 51A provided in the hole 72A communicating with one of the pair of the holes 70A and the upper end of one of the channel body layers 51B provided in the hole 72B communicating with one of the pair of the holes 70B and adjacent to the channel body layer 51A.

The electrode pad 80 is provided in islands on the interlayer insulating film 66. The electrode pad 80 may be referred to as a landing pad because of the form of the electrode pad 80 provided in islands. It is noted that the electrode pad 80 is connected to the channel body layer 51A through a via electrode (a first via) 81A. The electrode pad 80 is connected to the channel body layer 51B through a via electrode (a first via) 81B.

An interlayer insulating film 67 (a third interlayer insulating film) such as a silicon oxide film is provided on the electrode pad 80. A via electrode 82 electrically connected to the electrode pad 80 is provided in the interlayer insulating film 67. The bit line BL electrically connected to the via electrode 82 is provided on the interlayer insulating film 67.

The upper end of the channel body layer 51A provided in a hole 71A communicating with the other of the pair of the holes 70A is electrically connected to a source line SL (a first source line). The upper end of the channel body layer 51B provided in a hole 71B communicating with the other of the pair of the holes 70B is electrically connected to a source line SL (a second source line). The channel body layer 51A is connected to the source line SL through a via electrode (a second via) 84A. The channel body layer 51B is connected to the source line SL through a via electrode (a second via) 84B.

A barrier film (a first barrier film) 80a may be provided on an interface between the electrode pad 80 and the insulating layer 86 and an interface between the electrode pad 80 and the interlayer insulating film 66. A barrier film (a second barrier film) SLa may be provided on an interface between the source line SL and the insulating layer 86 and an interface between the source line SL and the interlayer insulating film 66. A barrier film (a third barrier film) BLa may be provided on an interface between the bit line BL and the interlayer insulating film 67.

In the embodiment, the electrode pad 80 includes the barrier film 80a in the electrode pad. The source line SL includes the barrier film SLa in the source line. The bit line BL includes the barrier film BLa in the bit line.

Figure 4A:
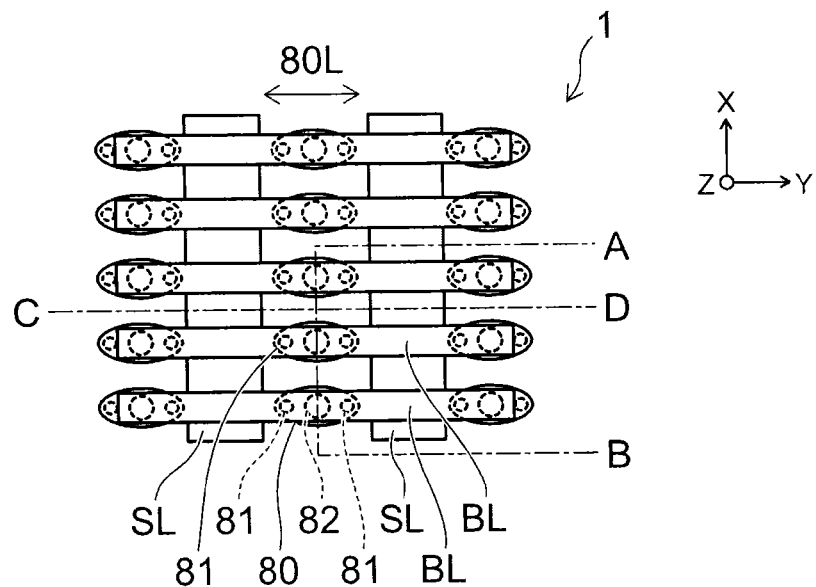
FIG. 4A to FIG. 4C are schematic views of the memory cell array of the nonvolatile semiconductor memory device according to the first embodiment.
Figure 4B:
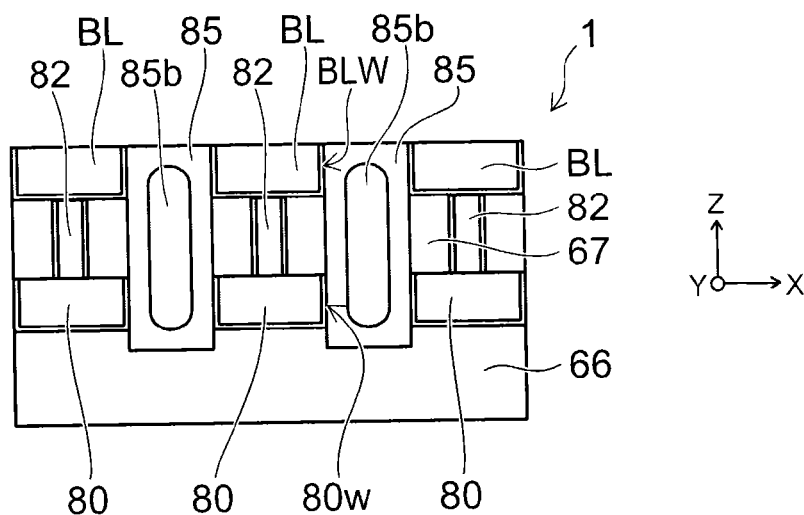
Figure 4C:
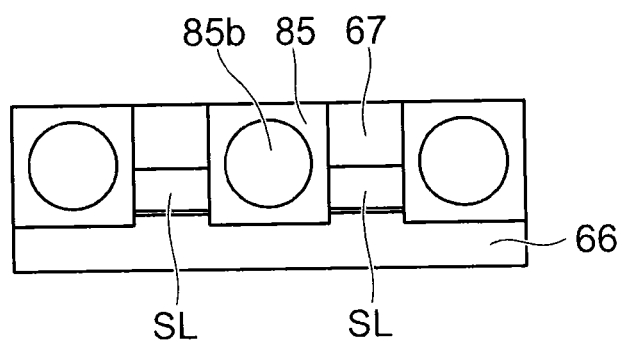

FIG. 4A to FIG. 4C are schematic views illustrating the memory cell array of the nonvolatile semiconductor memory device according to the first embodiment. FIG. 4A is a schematic top view illustrating the memory cell array. FIG. 4B is a schematic cross sectional view at a position along a line A-B in FIG. 4A. FIG. 4C is a schematic cross sectional view along a line C-D in FIG. 4A. FIG. 4B and FIG. 4C do not show portions below the interlayer insulating film 66.

As shown in FIG. 4A, when the electrode pad 80 is seen from the stacking direction of the stacked body 53, the shape of the electrode pad 80 is elliptic. A major axis 80L of the elliptic electrode pad 80 is nearly in parallel with the extending direction of the bit line BL. The bit line BL is nearly orthogonal to the source line SL. The electrode pad 80 and the source line SL are alternately disposed in the Y-direction.

As shown in FIG. 4B, the nonvolatile semiconductor memory device 1 includes an insulating layer 85 facing a side face BLW of the bit line BL and a side face 80W of the electrode pad 80. The insulating layer 85 is provided on the side face BLW of the bit line BL and the side face 80W of the electrode pad 80.

The insulating layer 85 may directly contact with the side face BLW of the bit line BL and the side face 80W of the electrode pad 80, or may contact with the side face BLW of the bit line BL and the side face 80W of the electrode pad 80 through a different insulating layer. A void 85b is provided in the insulating layer 85, reaching from the side face BLW of the bit line BL to the side face 80W of the electrode pad 80. The void 85b may be referred to as an air gap 85b.

As shown in FIG. 4C, the insulating layer 85 exists between the adjacent source lines SL as well as between the adjacent electrode pads 80.

Next, manufacturing processes for the nonvolatile semiconductor memory device 1 according to the first embodiment will be described.

FIG. 5A to FIG. 11C are schematic cross sectional views for describing the manufacturing processes for the nonvolatile semiconductor memory device according to the first embodiment. The schematic cross sectional views shown below are cross-sectional views cutting the center of the memory hole MH in parallel with the Y-direction shown in FIG. 1.

Figure 5A:
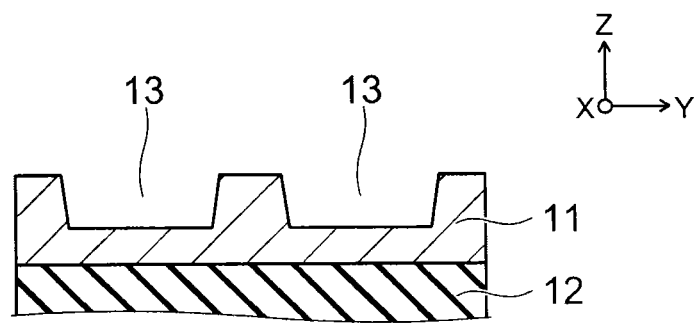
FIG. 5A to FIG. 11C are schematic cross sectional views for describing the manufacturing processes for the nonvolatile semiconductor memory device according to the first embodiment.

First, as shown in FIG. 5A, the semiconductor layer 11 containing an impurity element is formed on the base layer 12. The base layer 12 includes transistors, interconnections, interlayer insulating films, and so on of a peripheral circuit to control the memory cell.

Subsequently, a groove 13 is formed on the semiconductor layer 11 by photolithography processing. The position of the groove 13 corresponds to the position of the joining portion JP to join the lower end of the memory hole MH to the semiconductor layer 11.

Figure 5B:
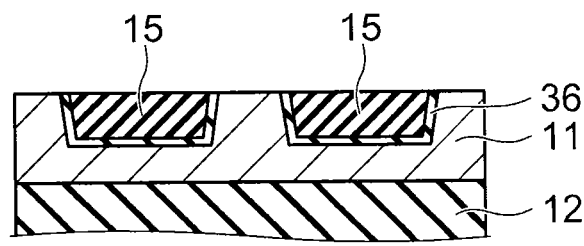

Subsequently, as shown in FIG. 5B, the insulating film 36 is formed in the groove 13, and a non-doped silicon sacrificial film 15 is formed in the groove 13 through the insulating film 36. The non-doped silicon sacrificial film 15 is a non-doped silicon film, for example. An excess portion of the non-doped silicon sacrificial film 15 is removed by etch back to expose the surface of the semiconductor layer 11 between the adjacent non-doped silicon sacrificial films 15.

In this stage, the semiconductor layer 11 is formed on the base layer 12, including an impurity containing region containing an impurity element and a region to be etched at the impurity concentration lower than the impurity concentration of the impurity containing region. The impurity containing region is the semiconductor layer 11 sandwiched between the adjacent non-doped silicon sacrificial films 15, and the region to be etched is the non-doped silicon sacrificial film 15. The non-doped silicon sacrificial film 15 is disposed in multiple numbers at a predetermined distance in the X-direction or the Y-direction.

Figure 5C:
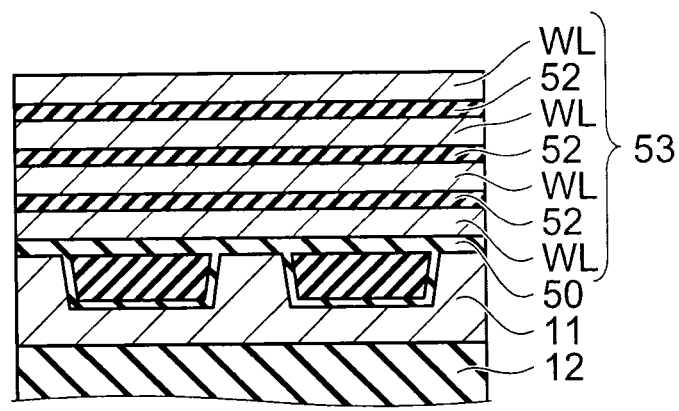

Subsequently, as shown in FIG. 5C, the insulating film 50 is formed on the semiconductor layer 11 and the non-doped silicon sacrificial film 15. Subsequently, the stacked body 53 is formed on the base layer 12 through the insulating film 50. The stacked body 53 includes the plurality of electrode layers WL and a plurality of etched layers 52 alternately stacked on each other. The etched layer 52 is a non-doped polysilicon layer. The stacked body 53 is a stacked body including the electrode layer WL and the etched layer 52 stacked in multiple layers. The stacked body 53 includes the etched layer 52 between the plurality of electrode layers WL.

Figure 6A:
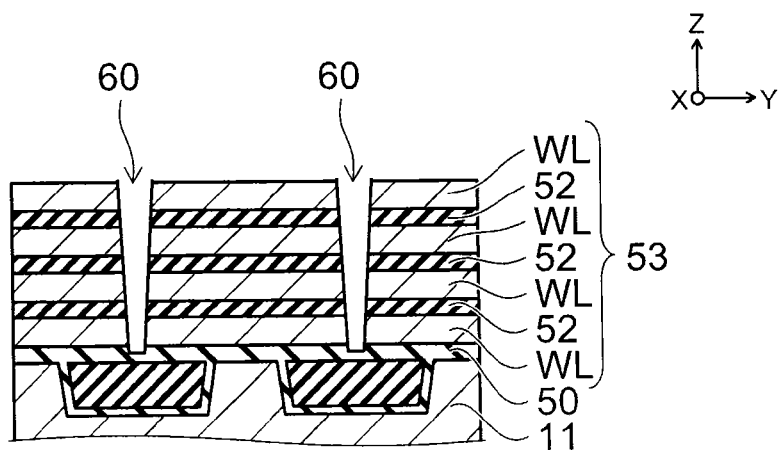

The base layer 12 is omitted in the drawings after FIG. 6A.

As shown in FIG. 6A, a slit 60 is formed by photolithography processing, reaching from the surface of the stacked body 53 to the insulating film 50. The slit 60 extends in the X-direction. In this stage, the stacked body 53 is divided in the Y-direction by the slit 60. In this dividing, the insulating film 50 functions as an etch stop layer.

Figure 6B:
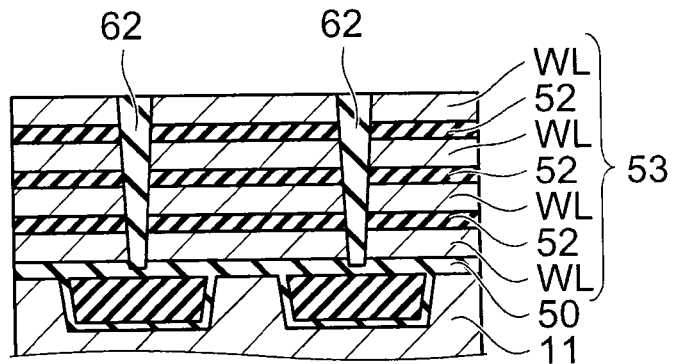

Subsequently, as shown in FIG. 6B, the insulating layer 62 is formed in the slit 60. An excess portion of the insulating layer 62 is removed by etch back as necessary, and the topmost electrode layer WL is exposed.

Figure 6C:
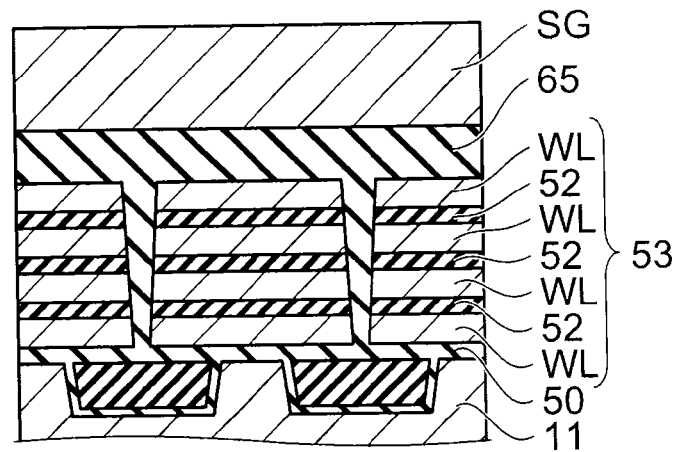

Subsequently, as shown in FIG. 6C, the interlayer insulating film 65 is formed on the stacked body 53 and the insulating layer 62. Subsequently, the select gate SG is formed on the interlayer insulating film 65. Thus, the stacked body 54 is formed on the stacked body 53.

Figure 7A:
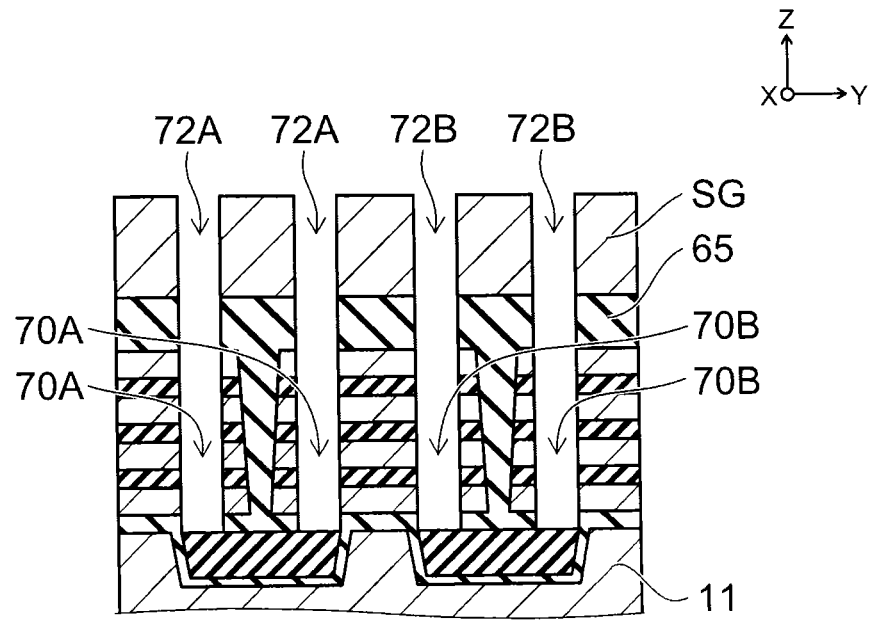

Subsequently, as shown in FIG. 7A, the pairs of the holes 72A and 72B are formed by photolithography processing, piercing through the stacked body 54 and reaching the stacked body 53. The pairs of the holes 70A and 70B are further formed, piercing through the stacked body 53 and reaching the non-doped silicon sacrificial film 15. The pairs of the holes 70A and 70B each sandwich the insulating layer 62, and pierce from the top surface to the lower surface of the stacked body 53. The etched layer 52 provided between the plurality of electrode layers WL is exposed in the pairs of the holes 70A and 70B.

Figure 7B:
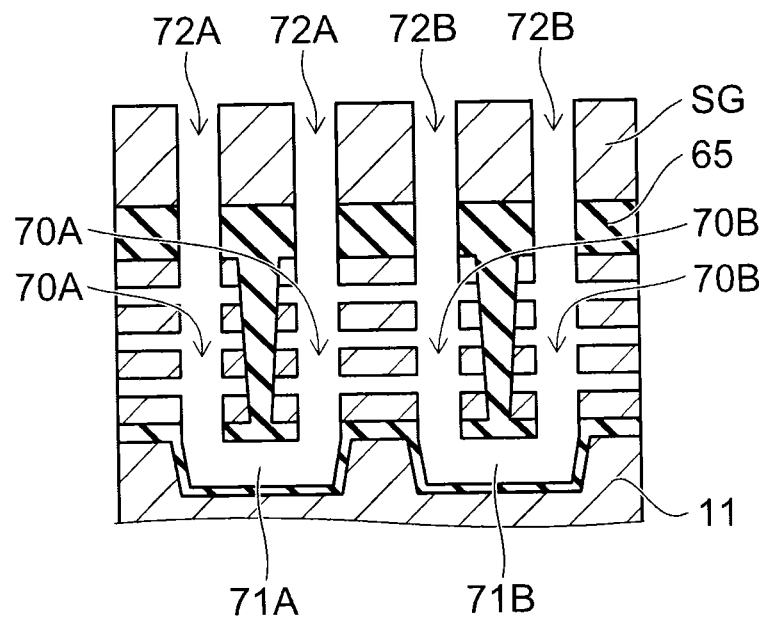

Subsequently, as shown in FIG. 7B, the non-doped silicon sacrificial film 15 (the region to be etched) and the etched layer 52 provided between the plurality of electrode layers WL are removed through the pairs of the holes 70A and 70B and the pairs of the holes 72A and 72B. For example, alkaline chemical solution treatment is applied in the holes 70A and 70B, whereby the non-doped silicon sacrificial film 15 and the etched layer 52 are removed through the pairs of the holes 70A and 70B and the pairs of the holes 72A and 72B. For an alkaline chemical solution, a KOH (potassium hydroxide) solution is used.

Thus, spaces (recesses) 71A and 71B are formed in the semiconductor layer 11, respectively connected to the lower ends of the pairs of the holes 70A and 70B. After forming the pairs of the holes 70A and 70B, the surfaces of the plurality of electrode layers WL are individually exposed.

Figure 8A:
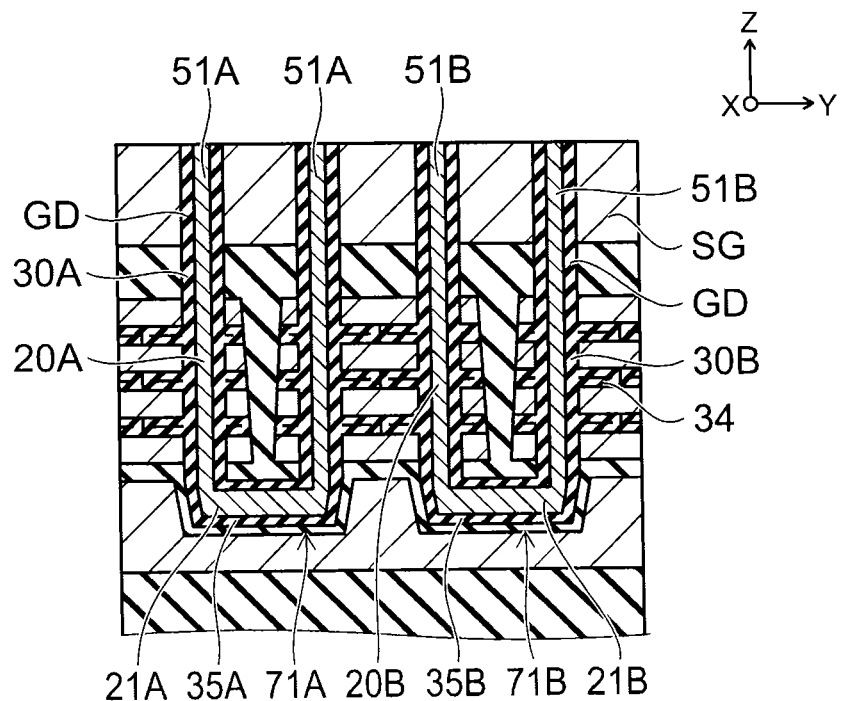

Subsequently, as shown in FIG. 8A, the memory film 30A including the charge storage film 32 is formed on the sidewalls of the pair of the holes 70A. The insulating film 34 is further formed between the plurality of electrode layers WL. The insulating layer 35A including the charge storage film 32 is formed on the inner wall of the space 71A. The gate insulating film GD is further formed on the sidewalls of the pair of the holes 72A. The memory film 30A, the insulating film 34, the insulating layer 35A, and the gate insulating film GD are formed by atomic layer deposition (ALD), for example.

The memory film 30B including the charge storage film 32 is formed on the sidewalls of the pair of the holes 70B. The insulating film 34 is further formed between the plurality of electrode layers WL. The insulating layer 35B including the charge storage film 32 is formed on the inner wall of the space 71B. The gate insulating film GD is further formed on the sidewalls of the pair of the holes 72B. The memory film 30B, the insulating film 34, the insulating layer 35B, and the gate insulating film GD are formed by atomic layer deposition (ALD), for example.

Subsequently, the channel body layer 20A is formed on the surface of the memory film 30A as well as the channel body layer 21A is formed on the surface of the insulating layer 35A. The channel body layer 51A is formed on the surface of the gate insulating film GD. The channel body layer 20B is formed on the surface of the memory film 30B as well as the channel body layer 21B is formed on the surface of the insulating layer 35B. The channel body layer 51B is formed on the surface of the gate insulating film GD.

Figure 8B:
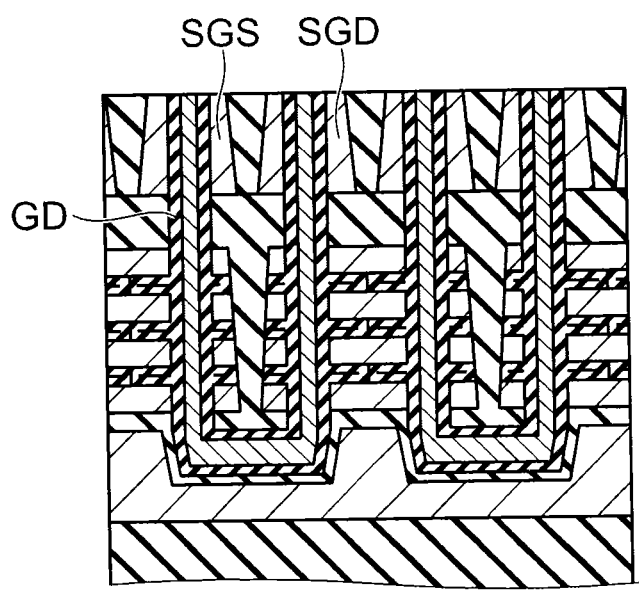

Subsequently, as shown in FIG. 8B, the select gate SG is separated by photolithography processing to form the drain-side select gate SGD and the source-side select gate SGS.

Figure 9A:
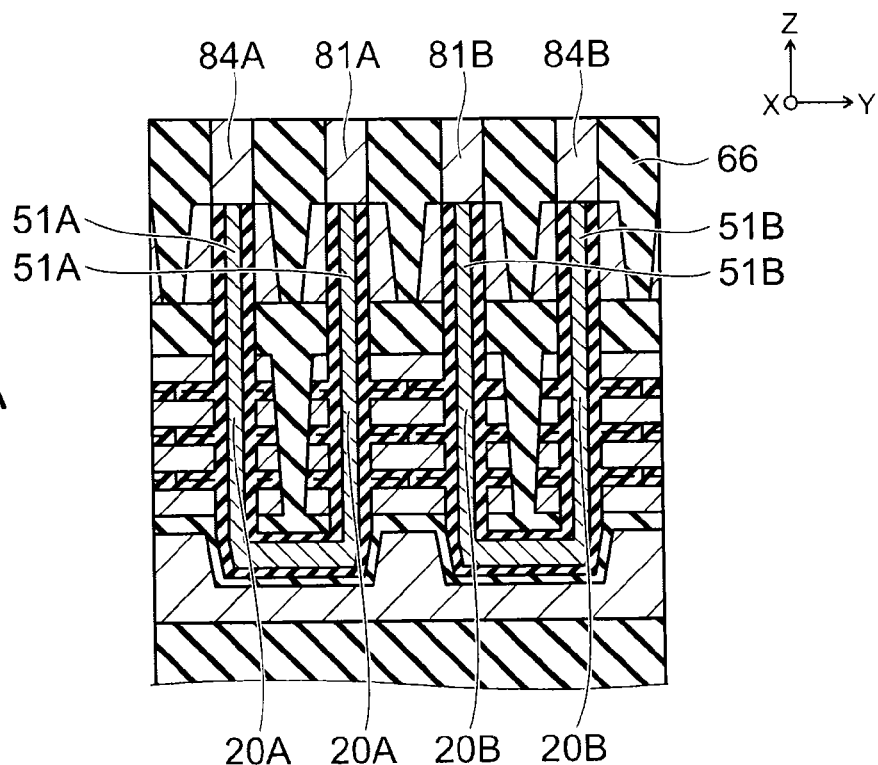

Subsequently, as shown in FIG. 9A, the interlayer insulating film 66 is formed on the select gate SG.

The via electrode 81A connected to the upper end of one of the channel body layers 51A and the via electrode 84A connected to the upper end of the other of the channel body layers 51A are formed in this interlayer insulating film 66 by photolithography processing and film forming techniques. The via electrode 81B connected to the upper end of one of the channel body layers 51B and the via electrode 84B connected to the upper end of the other of the channel body layers 51B are formed.

Figure 9B:
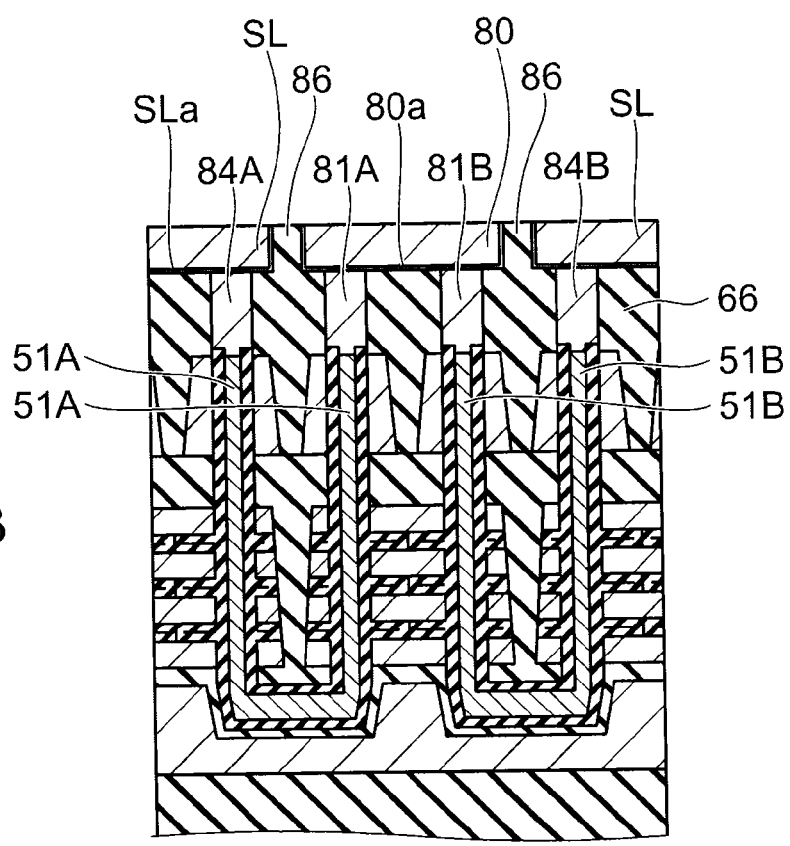

Subsequently, as shown in FIG. 9B, the electrode pad 80 is formed on the interlayer insulating film 66 using damascene or the like, for example. The electrode pad 80 is electrically connected to the upper end of one of the channel body layers 51A and the upper end of one of the channel body layers 51B adjacent to this channel body layer 51A through the via electrode.

The source line SL is further formed on the interlayer insulating film 66 in addition to the electrode pad 80. The source line SL is electrically connected to the upper end of the other of the channel body layers 51A and the upper end of the other of the channel body layers 51B through the via electrode.

The electrode pad 80 and the source line SL are formed by the same damascene processing, for example. The top surface of the electrode pad 80, the top surface of the source line SL, and the top surface of the insulating layer 86 remaining between the electrode pad 80 and the source line SL are made flush by CMP (Chemical Mechanical Polishing), for example.

The barrier film 80a may be formed beforehand on the interface between the electrode pad 80 and the insulating layer 86 and the interface between the electrode pad 80 and the interlayer insulating film 66. The barrier film SLa may be formed beforehand on the interface between the source line SL and the insulating layer 86 and the interface between the source line SL and the interlayer insulating film 66.

Subsequently, manufacturing processes for the portions above the electrode pad 80 will be described. Schematic views shown below correspond to the cross section on the line A-B in FIG. 4.

Figure 10A:
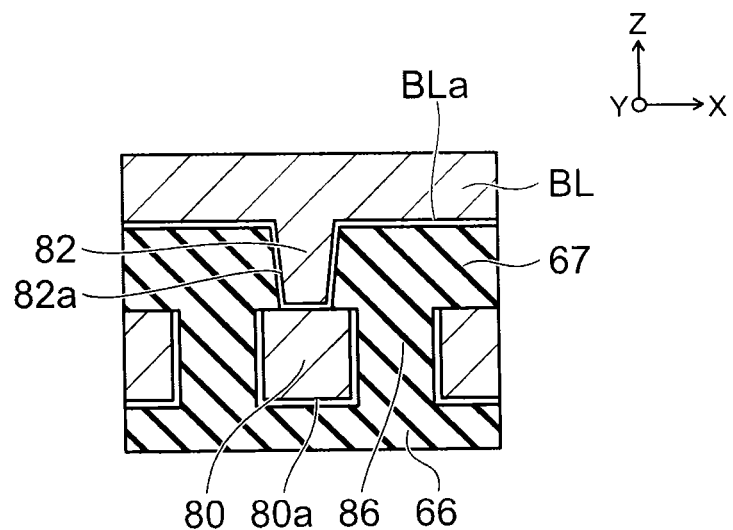

As shown in FIG. 10A, the interlayer insulating film 67 is formed on the electrode pad 80. Subsequently, the via electrode 82 connected to the electrode pad 80 is formed in the interlayer insulating film 67. A barrier film 82a may be formed beforehand between the via electrode 82 and the interlayer insulating film 67. The via electrode 82 includes the barrier film 82a in the via electrode. Subsequently, a bit line layer BLF connected to the via electrode 82 is formed on the interlayer insulating film 67.

Figure 10B:
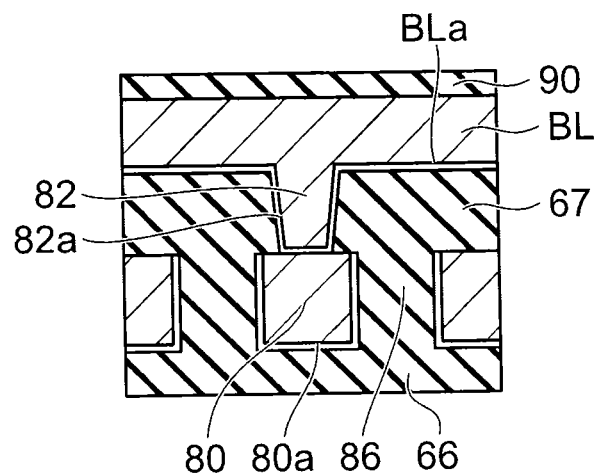
Figure 10C:
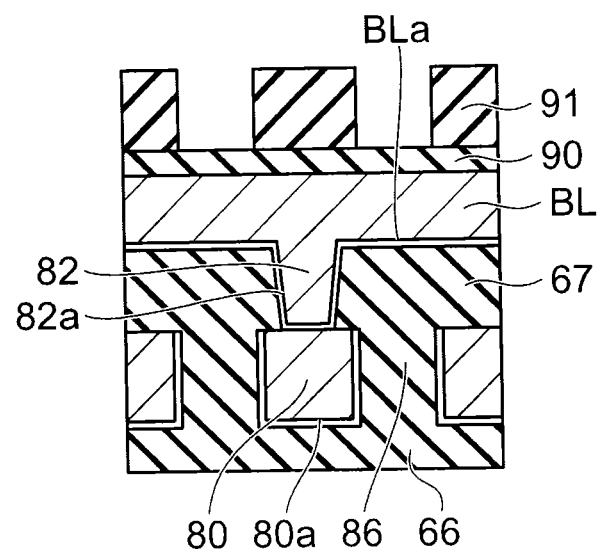

After forming the bit line layer BLF, as shown in FIG. 10B, a hard mask layer 90 is formed on the bit line layer BLF. Subsequently, as shown in FIG. 10C, a resist pattern 91 is formed on the hard mask layer 90 by photolithography processing. The hard mask layer 90 is patterned using this resist pattern 91.

Figure 11A:
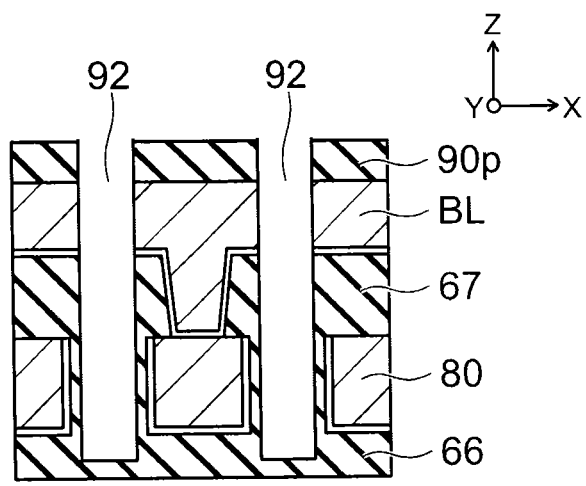

As shown in FIG. 11A, a trench 92 is formed below the surface of the bit line layer BLF exposed from a mask pattern 90p made of a hard mask material. The trench 92 pierces from the surface of the bit line layer BLF to the interlayer insulating film 67, and reaches the interlayer insulating film 66 through the side face 80W of the electrode pad 80. The bottom part of the trench 92 is located below the lower surface of the electrode pad 80. This trench 92 is formed to divide the bit line layer BLF for forming the bit line BL. As described above, the bit line BL extends in the Y-direction (see FIG. 4A). Since the extending direction of the bit line BL and the major axis of the electrode pad 80 are oriented to the same Y-direction, the trench 92 facing each side face can be collectively formed.

Figure 11B:
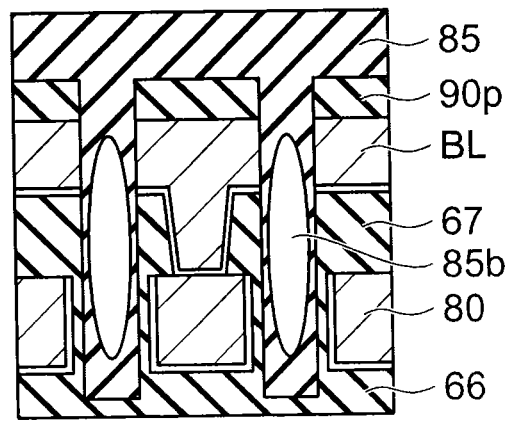

Subsequently, as shown in FIG. 11B, the insulating layer 85 facing the mask pattern 90p, the side face BLW of the bit line BL, and the side face 80W of the electrode pad 80 is formed. The insulating layer 85 is formed under the conditions that the trench 92 is not buried excellently. Thus, the void 85b reaching from the side face BLW of the bit line BL to the side face 80W of the electrode pad 80 is formed in the insulating layer 85 in the trench 92. Namely, the void 85b is formed across the heights to cover the side face of the bit line BL and the side face of the electrode pad 80.

In the first embodiment, a deep trench 92 is formed beforehand with the bottom part of the trench 92 located below the bottom face of the electrode pad 80. The insulating layer 85 is then formed in this trench 92. According to such a scheme, it is made possible to facilitate forming the void reaching from the side face BLW of the bit line BL to the side face 80W of the electrode pad 80.

Figure 11C:
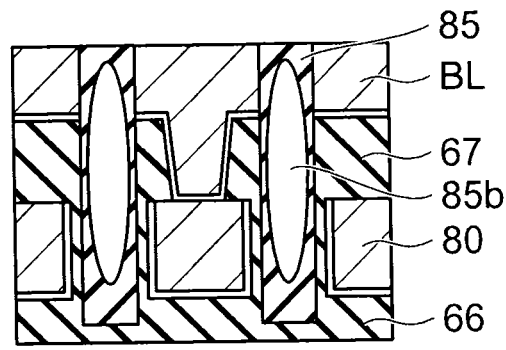

After this forming, as shown in FIG. 11C, the insulating layer 85 formed above the mask pattern 90p and the mask pattern 90p are removed by CMP. The nonvolatile semiconductor memory device 1 is formed by these manufacturing processes.

According to the first embodiment, the memory strings MS adjacent in the Y-direction are electrically connected to each other using the same electrode pad 80. Since the potentials of the pair of the channel body layers electrically connected to the electrode pad 80 are the same potential, no electrical problems arise even though the pair of the channel body layers are connected to the same electrode pad 80.

Suppose that in the case where the electrode pad 80 is not provided, it is necessary to extend the via electrodes 81A and 81B connected to the memory strings MS to the bit line BL. However, when the downscaling of the individual portions in the memory cell advances to downscale the bit line BL, the via electrode, or the memory string MS, the alignment between the via electrodes 81A and 81B and the bit line BL or the alignment between the via electrodes 81A and 81B and the memory string MS becomes difficult. Consequently, it is likely that a problem arises in the electrical connection between the via electrodes 81A and 81B and the bit line BL or in the electrical connection between the via electrodes 81A and 81B and the memory string MS.

In the first embodiment, the electrode pad 80 is provided between the via electrodes 81A and 81B and the memory string MS, thereby easily and surely establishing the electrical connection between the via electrodes 81A and 81B and the bit line BL or the electrical connection between the via electrodes 81A and 81B and the memory string MS.

The planar configurations of the electrode pad 80 are elliptic. Therefore, the degree of freedom in design of the via electrode 82 connecting the bit line BL to the electrode pad 80 increases. For example, the cross section of the via electrode 82 (the cross section in the XY-plane) is unnecessary to be a perfect circle. For example, the cross section of the via electrode 82 may be made elliptic according to the planar configurations of the electrode pad 80. An elliptic cross section of the via electrode 82 increases the contact area between the bit line BL and the electrode pad 80, and further reduces the contact resistance between the bit line BL and the electrode pad 80.

The electrode pad 80 is provided between the via electrodes 81A and 81B and the memory string MS, whereby the via electrode 82 is located between the bit line BL and the electrode pad 80. Thus, the aspect ratio of the via electrode 82 is not increased, and the barrier film 82a can be formed by PVD (Physical Vapor Deposition), not by CVD (Chemical Vapor Deposition). Thus, the barrier film 82a is formed easily, and the manufacturing costs of the barrier film 82a are further reduced.

According to the first embodiment, the insulating layer 85 is provided across the bit line BL and the electrode pad 80. This insulating layer 85 includes the void 85b reaching from the side face BLW of the bit line BL to the side face 80W of the electrode pad 80. Namely, the insulating layer 85 formed with the void 85b faces both the bit line BL and the electrode pad 80. Thus, the parasitic capacitance around the bit line BL or the electrode pad 80 is reduced. Therefore, it is made possible to increase the speed of the read operation of the nonvolatile semiconductor memory device 1.

Particularly, since the electrode pad 80 has the structure in which the major axis extends in the Y-direction, it is likely that the parasitic capacitance around the electrode pad 80 increases if a solid insulating layer (a dielectric layer) is disposed on the side face 80W of the electrode pad 80. However, in the first embodiment, the insulating layer 85 including the void 85b is disposed on the side face 80W of the electrode pad 80, thereby inevitably reducing the parasitic capacitance around the electrode pad 80.

According to the first embodiment, the trench 92 across the bit line BL and the electrode pad 80 is collectively formed. The insulating layer 85 is then formed in this trench 92. Therefore, the number of the manufacturing process steps in forming the insulating layer 85 is reduced, and the manufacturing costs in forming the insulating layer 85 are reduced. Since the trench 92 is collectively formed, the margin in photolithography processing in forming this trench will not be reduced.

Since the electrode pad 80 and the source line SL can be manufactured by the same manufacturing process steps, it is possible to simply form the electrode pad 80 together with the source line SL. Therefore, even though the electrode pad 80 is newly additionally provided in the nonvolatile semiconductor memory device 1, the costs for the manufacturing process steps will not be increased.

Here, processes for forming an insulating layer including an electrode pad, a bit line, and a void according to a reference sample will be described.

FIG. 12A to FIG. 14 are schematic cross sectionals view for describing the processes for forming the insulating layer including the electrode pad, the bit line, and the void according to the reference sample. Schematic views shown below correspond to the cross section on the line A-B in FIG. 4.

In the reference sample, an electrode pad 80, a bit line BL, and an insulating layer 110 are formed by repeating a routine from FIG. 12A to FIG. 13C twice. Namely, a conductive layer 100 illustrated below corresponds to the electrode pad 80 or the bit line BL.

Figure 12A:
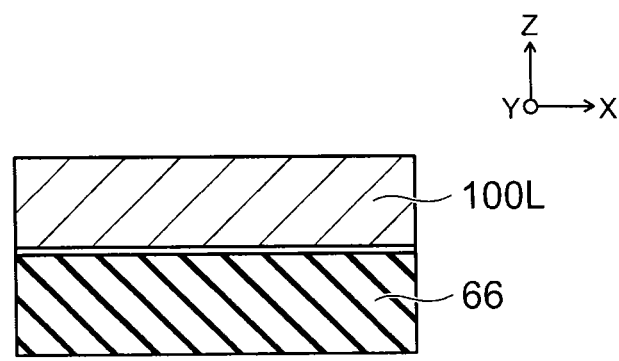
FIG. 12A to FIG. 14 are schematic cross sectionals view for describing the processes for forming the insulating layer including the electrode pad, the bit line, and the void according to the reference sample.

First, as shown in FIG. 12A, a conductive material layer 100L is formed on an interlayer insulating film 66.

Figure 12B:
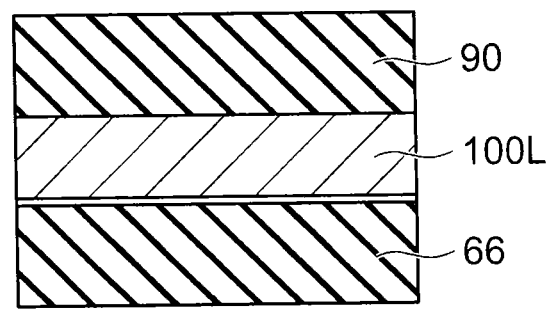

Subsequently, as shown in FIG. 12B, a hard mask layer 90 is formed on the conductive material layer 100L.

Figure 12C:
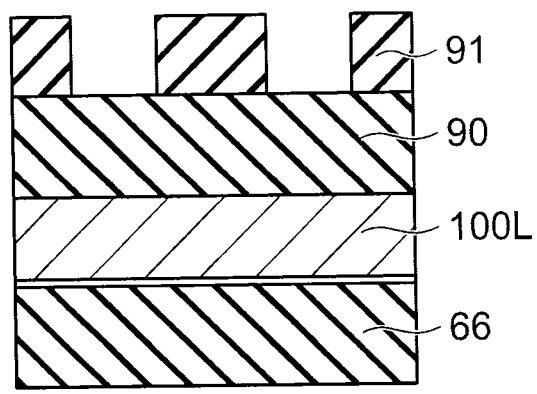

Subsequently, as shown in FIG. 12C, a resist pattern 91 is formed on the hard mask layer 90 by photolithography processing. The hard mask layer 90 is patterned using this resist pattern 91.

Figure 13A:
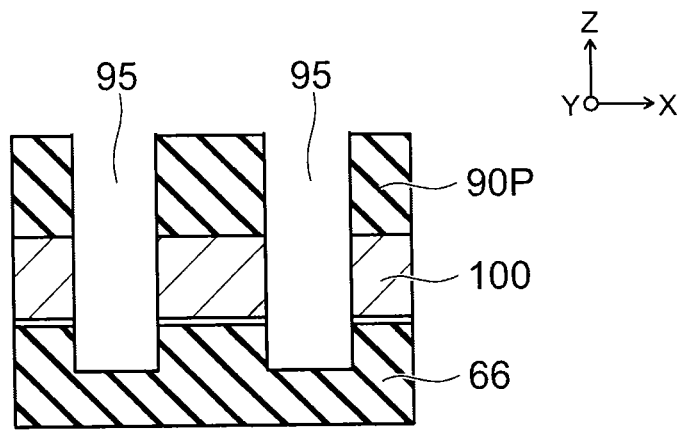

Subsequently, as shown in FIG. 13A, a trench 95 is formed downward from the surface of the conductive material layer 100L exposed from a mask pattern 90p made of a hard mask material. The trench 95 reaches from the surface of the conductive material layer 100L to the interlayer insulating film 66. The trench 95 is formed to divide the conductive material layer 100L for forming the conductive layer 100.

Figure 13B:
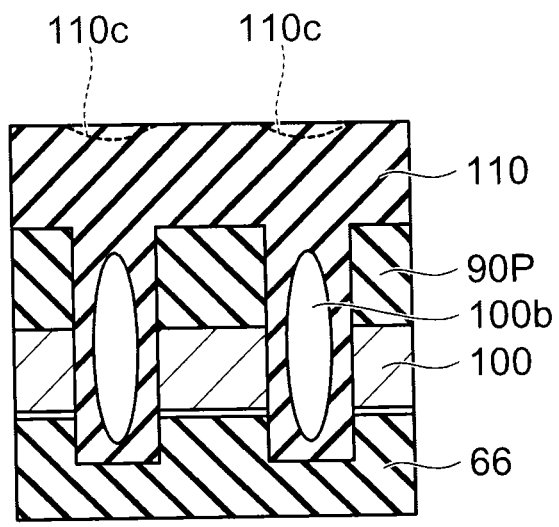

Subsequently, as shown in FIG. 13B, the insulating layer 110 facing the mask pattern 90p and the side face of the conductive layer 100 is formed. The insulating layer 110 is formed under the conditions that the trench 95 is not buried excellently. Thus, a void 110b is formed in the insulating layer 110 in the trench 95.

In the actual processes, a recess 110c is sometimes formed on the surface of the insulating layer 110 above the void 110b if the insulating layer 110 is formed in the trench 95. The recess 110c is depicted by a broken line in FIG. 13B.

Figure 13C:
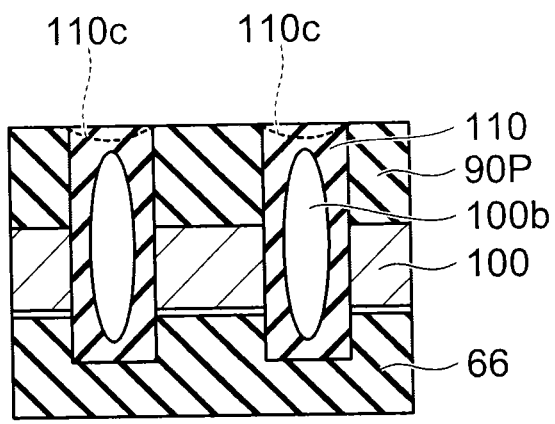

Subsequently, as shown in FIG. 13C, the insulating layer 110 formed above the mask pattern 90p is removed by CMP. The insulating layer 110 formed by CMP processing is affected by the recess 110c shown in FIG. 13B, and the recess 110c is left (transferred) on the insulating layer 110.

Figure 14:
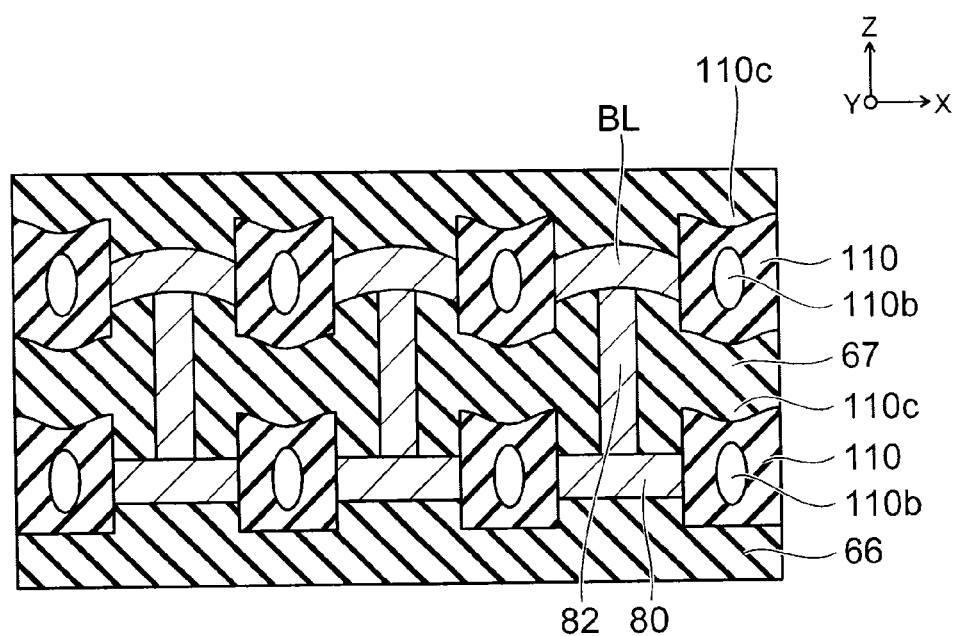

As described above, in the reference sample, the electrode pad 80, the bit line BL, and the insulating layer 110 are formed by repeating the routine from FIG. 12A to FIG. 13C twice. However, since the insulating layer 110 is formed every time when forming the electrode pad 80 and the bit line BL, transferring the recess 110c is also repeated. FIG. 14 shows a state after forming the electrode pad 80, the bit line BL, and the insulating layer 110.

Also in the reference sample, as shown in FIG. 14, the insulating layer 110 including the void 110b faces the side face 80W of the electrode pad 80 and the side face BLW of the bit line BL. Therefore, the parasitic capacitance around the bit line BL or the electrode pad 80 is reduced.

However, in the reference sample, the process steps of forming the insulating layer 110 are repeated for multiple times.

A step is sometimes generated on a base on which the bit line BL is formed if transferring the recess 110c is repeated for multiple times. For example, the portion in which the insulating layer 110 is formed sinks because of the influence of the recess 110c, sometimes generating a step on the base on which the bit line BL is formed. Therefore, in the reference sample, the focus margin for photolithography processing is sometimes reduced in forming the bit line BL.

On the contrary, in the first embodiment, the insulating layer 85 reaching from the side face BLW of the bit line BL to the side face 80W of the electrode pad 80 is formed by the manufacturing process steps at one time. In the first embodiment, the process steps of forming the insulating layer 85 are performed only one time, and transferring the recess 110c will not be repeated. Therefore, a step does not tend to be generated on the base on which the bit line BL is formed, and the aforementioned focus margin is secured.

Second Embodiment

Next, manufacturing processes for the portions above an electrode pad 80 according to a second embodiment will be described. Schematic cross sectional views illustrated below correspond to the cross section on the line A-B in FIG. 4.

FIG. 15A to FIG. 16C are schematic cross sectional views for describing the manufacturing processes for a nonvolatile semiconductor memory device according to the second embodiment.

Figure 15A:
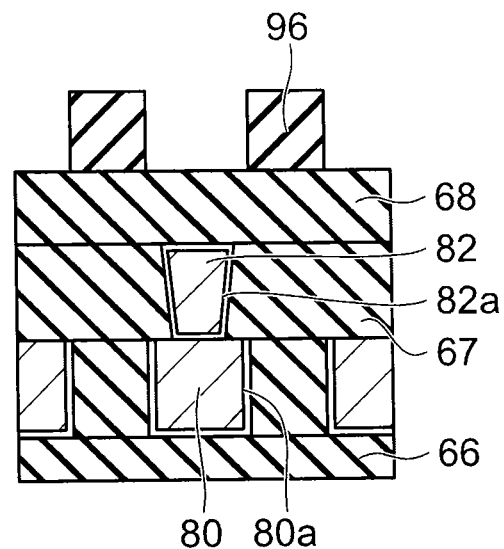
FIG. 15A to FIG. 16C are schematic cross sectional views for describing the manufacturing processes for a nonvolatile semiconductor memory device according to the second embodiment.
Figure 15B:
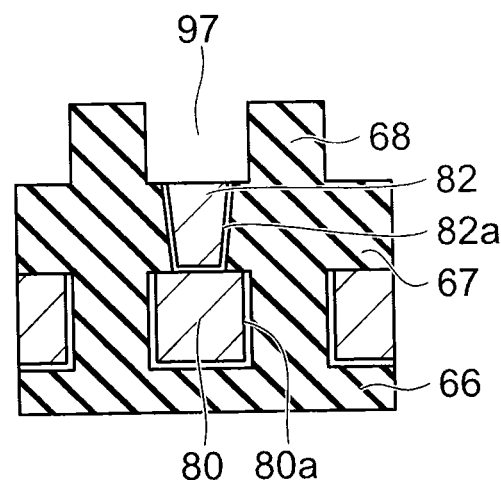

First, as shown in FIG. 15A, a via electrode 82 connected to the electrode pad 80 is formed on the electrode pad 80. Subsequently, an interlayer insulating film 67 is formed on the electrode pad 80. Subsequently, an insulating layer 68 is formed on the interlayer insulating film 67. A resist pattern 96 is formed on the insulating layer 68 by photolithography. The insulating layer 68 exposed from the resist pattern 96 is etched. Subsequently, the resist pattern 96 is removed. FIG. 15B shows this state.

As shown in FIG. 15B, a trench 97 is formed in the insulating layer 68.

Figure 15C:
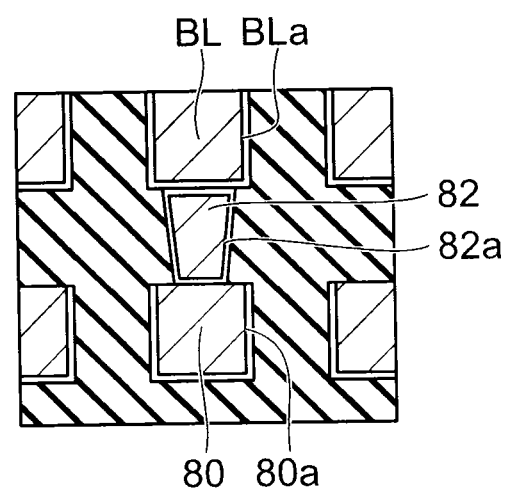

Subsequently, as shown in FIG. 15C, a bit line BL is formed in the trench 97 by damascene or the like. The top surface of the bit line BL is made flush with the top surface of the insulating layer 68 by CMP.

Figure 16A:
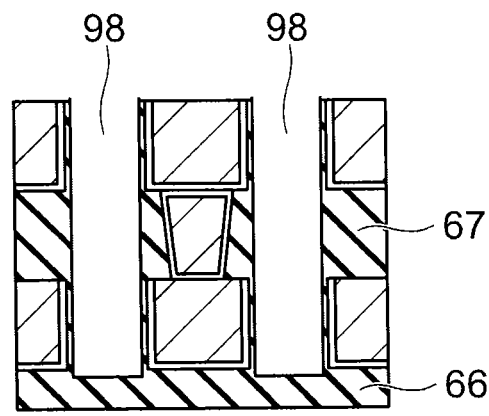

Subsequently, as shown in FIG. 16A, a trench 98 is formed downward from the surface of the bit line BL using the bit line BL itself for a mask. The trench 98 pierces from the surface of the bit line BL to the interlayer insulating film 67, and reaches from a side face 80W of the electrode pad 80 to the interlayer insulating film 66. The bottom part of the trench 98 is located below the lower surface of the electrode pad 80. As described above, the bit line BL extends in the Y-direction (see FIG. 4A). Since the extending direction of the bit line BL and the major axis of the electrode pad 80 are oriented to the same Y-direction, the trench 98 facing each side face can be collectively formed.

Figure 16B:
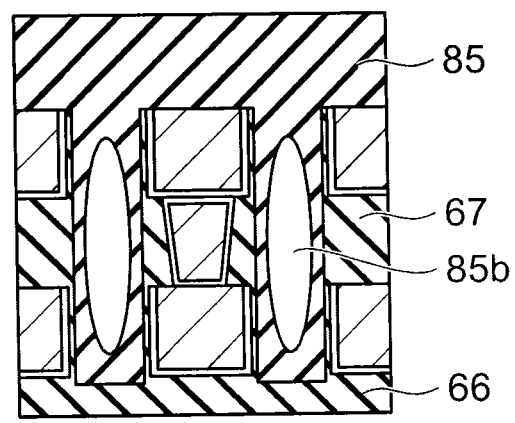

Subsequently, as shown in FIG. 16B, an insulating layer 85 facing a side face BLW of the bit line BL and the side face 80W of the electrode pad 80 is formed. The insulating layer 85 is formed under the conditions that the trench 98 is not buried excellently. Thus, a void 85b reaching from the side face BLW of the bit line BL to the side face 80W of the electrode pad 80 is formed in the insulating layer 85 in the trench 98.

In the second embodiment, a deep trench 98 is formed beforehand with the bottom part of the trench 98 located below the bottom face of the electrode pad 80. The insulating layer 85 is then formed in this trench 98. According to such a scheme, it is made possible to facilitate forming the void reaching from the side face BLW of the bit line BL to the side face 80W of the electrode pad 80.

Figure 16C:
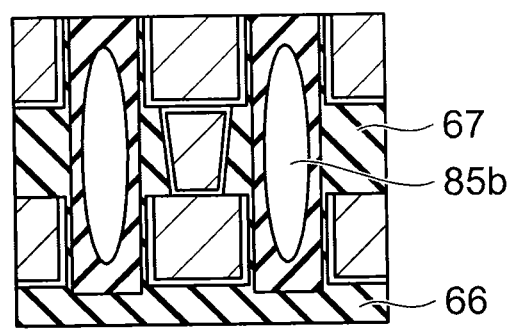

After this forming, as shown in FIG. 16C, the insulating layer 85 formed above the bit line BL is removed by CMP. A nonvolatile semiconductor memory device 1 is formed also by these manufacturing processes. Also in the second embodiment, the effect similar in the first embodiment is exerted. Particularly, according to the second embodiment, since the trench 98 is formed in a self-alignment manner using the bit line BL itself for a mask, the position accuracy of the trench 98 for forming the insulating layer 85 is further improved.

Hereinabove, exemplary embodiments are described with reference to specific examples. However, the embodiments are not limited to these specific examples. Namely, those whose design is appropriately modified and altered in these specific examples by a person skilled in the art are also included in the scope of the embodiments as long as they include the features of the embodiments. The components included in the foregoing specific examples and the disposition, materials, conditions, shape, size or the like of the components are not limited to those illustrated, which can be appropriately modified and altered.

Furthermore, the components included in the foregoing embodiments can be combined as long as technically feasible, and those combined are also included in the scope of the embodiments as long as they include the features of the embodiments. Additionally, a person skilled in the art can conceive various modifications and alterations within the spirit of the embodiments. All such modifications and alterations should therefore be seen as within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
   a semiconductor layer;
   a first stacked body including a plurality of electrode layers and a plurality of first insulating films alternately stacked on the semiconductor layer;
   a pair of first channel body layers piercing through the first stacked body in a stacking direction of the first stacked body, lower ends of the pair of the first channel body layers being connected to each other;
   a first memory film provided between the pair of the first channel body layers and the plurality of electrode layers;
   a pair of second channel body layers piercing through the first stacked body in the stacking direction of the first stacked body, lower ends of the pair of the second channel body layers being connected to each other;
   a second memory film provided between the pair of the second channel body layers and the plurality of electrode layers;
   a second stacked body including a first interlayer insulating film provided on the first stacked body and a select gate layer provided on the first interlayer insulating film;
   a second interlayer insulating film provided on the select gate layer of the second stacked body;
   a third channel body layer provided at an upper end of each of the pair of the first channel body layers and piercing through the second stacked body in a stacking direction of the second stacked body;
   a first gate insulating film provided between the third channel body layer and the select gate layer;
   a fourth channel body layer provided at an upper end of each of the pair of the second channel body layers and piercing through the second stacked body in the stacking direction of the second stacked body;
   a second gate insulating film provided between the fourth channel body layer and the select gate layer,
   the third channel body layer and the fourth channel body layer being disposed in a first direction perpendicular to the stacking direction,
   the device further comprising:
   a pad layer provided on the second interlayer insulating film and electrically connecting one of the adjacent third channel body layers to one of the fourth channel body layers;
   a bit line connected on the pad layer through a via electrode, the bit line extending in the first direction;
   a first source line connected to the other of the adjacent third channel body layers, the first source line extending in a second direction crossing to the first direction; and
   a second source line connected to the other of the adjacent fourth channel body layers, the second source line extending in the second direction.

2. The device according to claim 1, further comprising:
   a first via provided between the pad layer and the third channel body layer and between the pad layer and the fourth channel body layer.

3. The device according to claim 1,
   wherein a shape of the pad layer is elliptic when seeing the pad layer in the stacking direction of the first stacked body.

4. The device according to claim 3,
   wherein a direction of a major axis of the elliptic pad layer is nearly in parallel with an extending direction of the bit line.

5. The device according to claim 1, further comprising:
   an insulating layer provided on a side face of the bit line and a side face of the pad layer,
   a void being provided in the insulating layer.

6. The device according to claim 5,
   wherein the void is formed across heights covering the side face of the bit line and the side face of the pad layer.

7. The device according to claim 1, further comprising:
   a first barrier film provided between the pad layer and the second interlayer insulating film.

8. The device according to claim 1, further comprising:
   a second barrier film provided between the first source line and the second interlayer insulating film and between the second source line and the third insulating film.

9. The device according to claim 1, further comprising:
   a third interlayer insulating film provided between the bit line and the pad layer, between the bit line and the first source line, and between the bit line and the second source line; and
   a third barrier film provided between the bit line and the third interlayer insulating film.

10. The device according to claim 1, further comprising:
    an insulating layer provided between the side face of the bit line and the side face of the pad layer and between the first source line and the second source line,
    a void being provided in the insulating layer.

11. The device according to claim 5, further comprising:
    an insulating layer provided between the side face of the bit line and the side face of the pad layer and between the first source line and the second source line,
    a void being provided in the insulating layer.

12. The device according to claim 1, further comprising:
    a fifth channel body layer connected to lower ends of the pair of the first channel body layers.

13. The device according to claim 1, further comprising:
    a sixth channel body layer connected to lower ends of the pair of the second channel body layers.

14. The device according to claim 1, further comprising:
    a pair of fifth channel body layers provided on a side of the first channel body layers opposite to the second channel body layers, the fifth channel body layers piercing through the first stacked body in a stacking direction of the first stacked body, lower ends of the pair of the fifth channel body layers being connected to each other;
    a third memory film provided between the pair of the fifth channel body layers and the plurality of electrode layers;

a sixth channel body layer provided at an upper end of each of the pair of the fifth channel body layers and piercing through the second stacked body in the stacking direction; and a third gate insulating film provided between the sixth channel body layer and the select gate layer;

the first source line being connected to one of the sixth channel body layers.

\* \* \* \* \*